US012369395B2

(12) United States Patent
Zhao et al.

(10) Patent No.: US 12,369,395 B2
(45) Date of Patent: Jul. 22, 2025

(54) METHOD FOR GROWING MULTIPLE LAYERS OF SOURCE DRAIN EPITAXIAL SILICON IN FDSOI PROCESS

(71) Applicant: Shanghai Huali Integrated Circuit Corporation, Shanghai (CN)

(72) Inventors: Peng Zhao, Shanghai (CN); Nan Li, Shanghai (CN)

(73) Assignee: Shanghai Huali Integrated Circuit Corporation, Shanghai (CN)

( * ) Notice: Subject to any disclaimer, the term of this patent is extended or adjusted under 35 U.S.C. 154(b) by 420 days.

(21) Appl. No.: 18/173,934

(22) Filed: Feb. 24, 2023

(65) Prior Publication Data

US 2023/0274984 A1    Aug. 31, 2023

(30) Foreign Application Priority Data

Feb. 28, 2022    (CN) .......................... 202210185318.6

(51) Int. Cl.
*H01L 21/84*        (2006.01)
*H01L 27/12*        (2006.01)
*H10D 86/00*        (2025.01)
*H10D 86/01*        (2025.01)

(52) U.S. Cl.
CPC .......... *H10D 86/01* (2025.01); *H10D 86/201* (2025.01)

(58) Field of Classification Search
CPC ... H10D 62/153; H10D 62/154; H10D 62/314
See application file for complete search history.

(56) References Cited

U.S. PATENT DOCUMENTS

2021/0257456 A1*  8/2021  Asenov ................ H10D 64/021

* cited by examiner

*Primary Examiner* — John A Bodnar
(74) *Attorney, Agent, or Firm* — Banner & Witcoff, Ltd.

(57) ABSTRACT

The application provides a method for growing multiple layers of source drain epitaxial silicon in an FDSOI process, forming a buried oxide layer on the substrate, and then forming an SOI layer on the buried oxide layer; forming a gate on the SOI layer, wherein a source drain region is provided on two sides of the gate; forming an undoped epitaxial layer on the SOI layer of the source drain region; forming a first doped epitaxial layer on the undoped epitaxial layer; forming a second doped epitaxial layer on the first doped epitaxial layer; and cleaning the substrate with deionized water. In the present application, the epitaxial silicon is changed from a single layer structure to a multi-layer structure, wherein undoped epitaxial silicon can effectively prevent ion diffusion, and middle-highly doped epitaxial silicon and highly doped epitaxial silicon can significantly reduce source drain resistance and improve device performance.

9 Claims, 2 Drawing Sheets

METHOD FOR GROWING MULTIPLE LAYERS OF SOURCE DRAIN EPITAXIAL SILICON IN FDSOI PROCESS

CROSS-REFERENCE TO RELATED APPLICATIONS

This application claims priority to Chinese patent application No. 202210185318.6, filed on Feb. 28, 2022, the disclosure of which is incorporated herein by reference in its entirety.

TECHNICAL FIELD

The present application relates to the technical filed of semiconductors, in particular to a method for growing multiple layers of source drain epitaxial silicon in a fully depleted silicon on insulator (FDSOI) process.

BACKGROUND

Due to special process conditions of FDSOI, the growth of epitaxial silicon is required in a source drain region to prevent a contact from penetrating through an isolation layer. Moreover, the growth of highly doped epitaxial silicon (PMOS SiGe/NOS Sip) is required to reduce the resistance of the epitaxial silicon in the source drain region. For the NMOS, it is usually realized by growing Sip epitaxial silicon highly doped with P elements. The growth process is single growth of highly doped epitaxial silicon, and the doping elements are uniformly distributed in the epitaxial silicon. However, the process in the prior art cannot effectively prevent ion diffusion, and cannot reduce the source drain resistance.

BRIEF SUMMARY

In view of the above defect of the prior art, an object of the present application is providing a method for growing multiple layers of source drain epitaxial silicon in an FDSOI process, so as to solve the problem that the FDSOI process cannot effectively prevent ion diffusion and cannot reduce source-drain resistance in the prior art.

To achieve the above object and other related objects, the present application provides a method for growing multiple layers of source drain epitaxial silicon in an FDSOI process, at least including:
step 1, providing a substrate, forming a buried oxide layer on the substrate, and then forming a silicon-on-insulator (SOI) layer on the buried oxide layer;
step 2, forming a gate on the SOI layer, wherein a source drain region is provided on two sides of the gate;
step 3, forming an undoped epitaxial layer on the SOI layer of the source drain region;
step 4, forming a first doped epitaxial layer on the undoped epitaxial layer;
step 5, forming a second doped epitaxial layer on the first doped epitaxial layer; and
step 6, cleaning the substrate undergoing step 5 with deionized water.

In an example, the SOI layer in step 1 includes a first SOI layer and a second SOI layer on the first SOI layer.

In an example, the thickness of the first undoped epitaxial layer in step 3 is less than 50 angstroms.

In an example, a method for forming the undoped epitaxial layer in step 3 is a deposition method.

In an example, a method for forming the first doped epitaxial layer in step 4 is a deposition method.

In an example, a doping type of the first doped epitaxial layer formed in step 4 is P-type doping.

In an example, a method for forming the second doped epitaxial layer in step 5 is a deposition method.

In an example, a doping concentration of the first doped epitaxial layer in step 4 is less than a doping concentration of the second doped epitaxial layer in step 5.

In an example, the first undoped epitaxial layer in step 3 functions to prevent ions from diffusing to a channel.

As described above, the method for growing multiple layers of source drain epitaxial silicon in an FDSOI process of the present application has the following beneficial effects: in the present application, the epitaxial silicon is changed from a single layer structure to a multilayer structure, wherein undoped epitaxial silicon can effectively prevent ion diffusion, and middle-highly doped epitaxial silicon and highly doped epitaxial silicon can significantly reduce source drain resistance and improve device performance.

DETAILED DESCRIPTION OF THE DISCLOSURE

The implementation manners of the present application are described below using specific examples, and those skilled in the art could easily understand other advantages and effects of the present application from the content disclosed in the Description. The present application can also be implemented or applied in other different specific implementation manners, and various details in the Description can also be modified or changed based on different views and applications without departing from the spirit of the present application.

Figure 1:
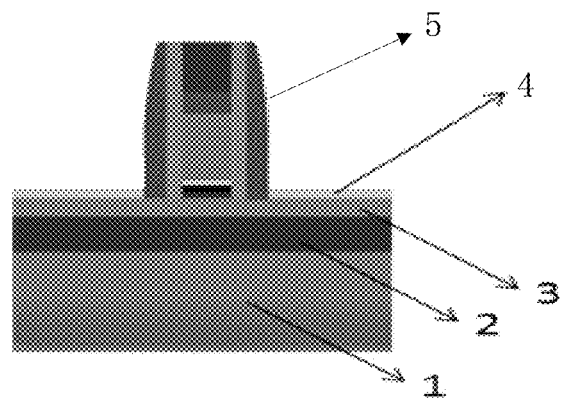
FIG. 1 is a schematic diagram of a structure of a buried oxide layer, an SOI layer, and a gate formed on a substrate in the present application.
Figure 2:
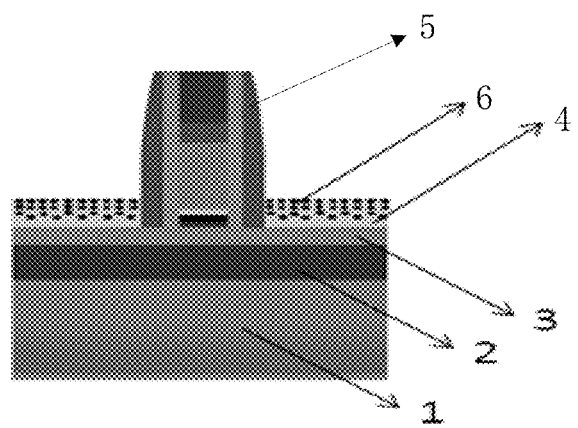
FIG. 2 is a schematic diagram of a structure where the gate is formed on the SOI layer in the present application.
Figure 3:
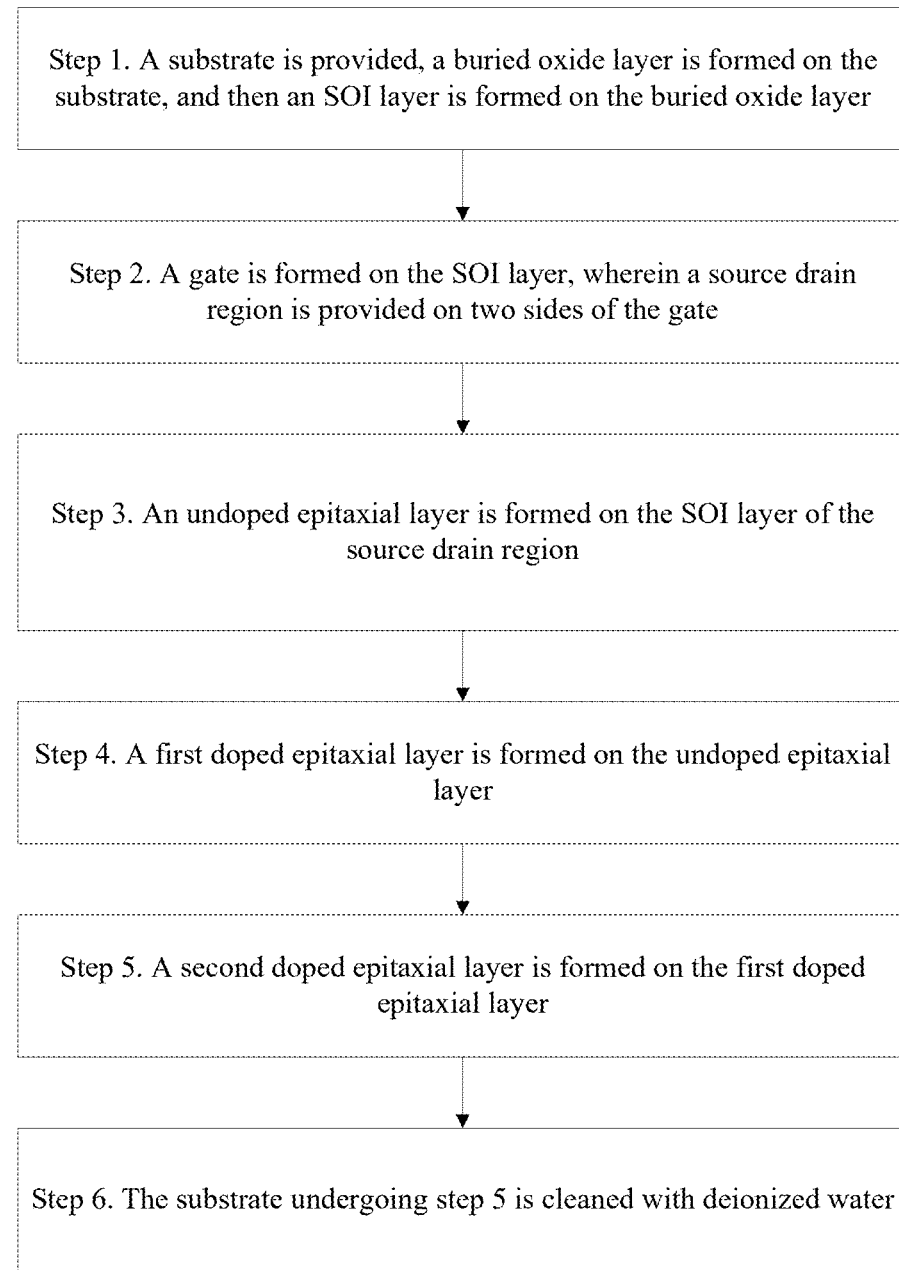
FIG. 3 is a flowchart of a method for growing multiple layers of source drain epitaxial silicon in an FDSOI process in the present application.

Please refer to FIGS. 1-3. It should be noted that the figures provided in the embodiments are only intended to illustrate the basic concept of the present application in a schematic way, so the figures only show the components related to the present application instead of being drawn according to the number, shape, and size of components in actual implementation. The type, number, and proportion of the components in actual implementation can be changed randomly, and the layout type of the components may be more complex.

The present application provides a method for growing multiple layers of source drain epitaxial silicon in an FDSOI process. Referring to FIG. 3, FIG. 3 is a flowchart of the method for growing multiple layers of source drain epitaxial silicon in an FDSOI process in the present application. The method at least includes the following steps.

Step 1. A substrate is provided, a buried oxide layer is formed on the substrate, and then an SOI layer is formed on the buried oxide layer. Referring to FIG. 1, FIG. 1 is a schematic diagram of a structure of the buried oxide layer, the SOI layer, and a gate formed on the substrate in the present application. In step 1, the buried oxide layer 2 is formed on the substrate 1, and then the SOI layer is formed on the buried oxide layer 2.

In this embodiment of the present application, the SOI layer in step 1 includes a first SOI layer and a second SOI layer on the first SOI layer. Referring to FIG. 1, the SOI layer in step 1 includes the first SOI layer 3 and the second SOI layer 4 on the first SOI layer 3.

Step 2. A gate is formed on the SOI layer, wherein a source drain region is provided on two sides of the gate. Referring to FIG. 2, FIG. 2 is a schematic diagram of a structure where the gate is formed on the SOI layer in the present application. In step 2, the gate 5 is formed on the SOI layer, wherein the source drain region is provided on two sides of the gate 5. The gate includes a stack structure and a spacer attached to a side wall of the stack structure.

Step 3. An undoped epitaxial layer is formed on the SOI layer of the source drain region.

In this embodiment of the present application, the thickness of the first undoped epitaxial layer in step 3 is less than 50 angstroms.

In this embodiment of the present application, a method for forming the undoped epitaxial layer in step 3 is a deposition method.

In this embodiment of the present application, the first undoped epitaxial layer in step 3 functions to prevent ions from diffusing to a channel.

The undoped epitaxial layer can effectively prevent diffusion of the P element in Sip to the channel which causes core device shift, while causing no increase in source-drain resistance that leads to attenuation of a leakage current.

Step 4. A first doped epitaxial layer is formed on the undoped epitaxial layer.

In this embodiment of the present application, a method for forming the first doped epitaxial layer in step 4 is a deposition method.

In this embodiment of the present application, a doping type of the first doped epitaxial layer formed in step 4 is P-type doping.

Step 5. A second doped epitaxial layer is formed on the first doped epitaxial layer.

In this embodiment of the present application, a method for forming the second doped epitaxial layer in step 5 is a deposition method.

In this embodiment of the present application, a doping concentration of the first doped epitaxial layer in step 4 is less than a doping concentration of the second doped epitaxial layer in step 5.

Referring to FIG. 2, FIG. 2 is a schematic diagram of a structure where first and second doped epitaxial layers are formed on the undoped epitaxial layer in the present application. The second doped epitaxial layer in FIG. 2 is located on the first doped epitaxial layer, that is, the first and second doped epitaxial layers (6) are stacked.

Step 6. The substrate undergoing step 5 is cleaned with deionized water. A polymer produced at the end of the deposition is cleaned to prevent the production of a defect.

A switch-on current can be effectively increased by using highly doped epitaxial silicon for the source and drain of an NMOS, and the leakage current decreases with the increase of the thickness of the first doped epitaxial layer. An optimal condition is that the first doped epitaxial layer and the second doped epitaxial layer are doped at a middle-high concentration and a high concentration, respectively.

The increases of the concentrations of the first and second doped epitaxial layers both can improve the switch-on current of the device, but an excessively high concentration of the first doped epitaxial layer may lead to poor Ion-Ioff uniformity.

To sum up, in the present application, the epitaxial silicon is changed from a single layer structure to a multilayer structure, wherein undoped epitaxial silicon can effectively prevent ion diffusion, and middle-highly doped epitaxial silicon and highly doped epitaxial silicon can significantly reduce source drain resistance and improve device performance. Therefore, the present application effectively overcomes various defects in the prior art and thus has high industrial utilization value.

The above embodiments merely exemplify the principle and effects of the present application, and are not intended to limit the present application. Any person familiar with the art can modify or change the above embodiments without violating the spirit and scope of the present application. Therefore, all equivalent modifications or changes made by those with ordinary knowledge in the art without departing from the spirit and technical ideas disclosed by the present application shall still be covered by the claims of the present application.

What is claimed is:

1. A method for growing multiple layers of source drain epitaxial silicon in a fully depleted silicon on insulator (FDSOI) process, at least comprising:
    step 1, providing a substrate, forming a buried oxide layer on the substrate, and then forming a silicon-on-insulator (SOI) layer on the buried oxide layer;
    step 2, forming a gate on the SOI layer, wherein a source drain region is provided on two sides of the gate;
    step 3, forming an undoped epitaxial layer on the SOI layer of the source drain region;
    step 4, forming a first doped epitaxial layer on the undoped epitaxial layer;
    step 5, forming a second doped epitaxial layer on the first doped epitaxial layer; and
    step 6, cleaning the substrate undergoing step 5 with deionized water.

2. The method for growing multiple layers of source drain epitaxial silicon in the FDSOI process according to claim 1, wherein the SOI layer in step 1 comprises a first SOI layer and a second SOI layer on the first SOI layer.

3. The method for growing multiple layers of source drain epitaxial silicon in the FDSOI process according to claim 1, wherein a thickness of the undoped epitaxial layer in step 3 is less than 50 angstroms.

4. The method for growing multiple layers of source drain epitaxial silicon in the FDSOI process according to claim 1, wherein a method for forming the undoped epitaxial layer in step 3 is a deposition method.

5. The method for growing multiple layers of source drain epitaxial silicon in the FDSOI process according to claim 1, wherein a method for forming the first doped epitaxial layer in step 4 is a deposition method.

6. The method for growing multiple layers of source drain epitaxial silicon in the FDSOI process according to claim 1, wherein a doping type of the first doped epitaxial layer formed in step 4 is P-type doping.

7. The method for growing multiple layers of source drain epitaxial silicon in the FDSOI process according to claim 1, wherein a method for forming the second doped epitaxial layer in step 5 is a deposition method.

8. The method for growing multiple layers of source drain epitaxial silicon in the FDSOI process according to claim 1, wherein a doping concentration of the first doped epitaxial layer in step 4 is less than a doping concentration of the second doped epitaxial layer in step 5.

9. The method for growing multiple layers of source drain epitaxial silicon in the FDSOI process according to claim 1, wherein the undoped epitaxial layer in step 3 functions to prevent ions from diffusing to a channel.

\* \* \* \* \*